(12) United States Patent
Ros Bengoechea et al.

(10) Patent No.: US 10,283,370 B1
(45) Date of Patent: May 7, 2019

(54) SILICON ADDITION FOR SILICON NITRIDE ETCHING SELECTIVITY

(71) Applicant: Applied Materials, Inc., Santa Clara, CA (US)

(72) Inventors: Onintza Ros Bengoechea, Mountain View, CA (US); Nancy Fung, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/909,790

(22) Filed: Mar. 1, 2018

(51) Int. Cl.
| | |
|---|---|
| H01L 21/302 | (2006.01) |
| H01L 21/311 | (2006.01) |
| C09K 13/08 | (2006.01) |
| H01L 21/67 | (2006.01) |
| H01L 21/768 | (2006.01) |
| H01L 21/306 | (2006.01) |
| H01L 21/3213 | (2006.01) |

(52) U.S. Cl.
CPC ........ *H01L 21/31116* (2013.01); *C09K 13/08* (2013.01); *H01L 21/30608* (2013.01); *H01L 21/31138* (2013.01); *H01L 21/32137* (2013.01); *H01L 21/67069* (2013.01); *H01L 21/76802* (2013.01)

(58) Field of Classification Search
CPC ........ H01L 21/30608; H01L 21/31138; H01L 21/32137; H01L 21/31116
USPC ................. 438/723, 724, 743, 744; 216/79
See application file for complete search history.

(56) References Cited

U.S. PATENT DOCUMENTS

| 6,716,758 B1* | 4/2004 | Donohoe .......... H01L 21/31116 257/E21.252 |
| 2013/0157470 A1* | 6/2013 | Watanabe ........... H01L 21/3065 438/724 |
| 2016/0079388 A1* | 3/2016 | Arvet ................ H01L 21/31144 438/151 |
| 2018/0025914 A1 | 1/2018 | Zhou et al. |

OTHER PUBLICATIONS

WikiHow, "How to Calculate Partial Pressure" via https://www.wikihow.com/Calculate-Partial-Pressure ; pp. 1-5; no date available.*
Chemistry Lebrtexts; "The Ideal Gas Law" via https://chem.libretexts.org/Textbook_Maps/Physical_and_Theoretical_Chemistry_Textbook_Maps/Supplemental_Modules_(Physical_and_Theoretical_Chemistry)/Physical_Properties_of_Matter/States_of_Matter/Properties_of_Gases/Gas_Laws/The_Ideal_Gas_Law ; pp. 1-10; No date.*

* cited by examiner

*Primary Examiner* — Binh X Tran
(74) *Attorney, Agent, or Firm* — Kilpatrick Townsend & Stockton LLP (57) ABSTRACT

Exemplary methods for selectively removing silicon nitride may include flowing a fluorine-containing precursor, and oxygen-containing precursor and a silicon-containing precursor into a local plasma to form plasma effluents. The plasma effluents may remove silicon nitride at significantly higher etch rates compared to exposed silicon oxide on the substrate. The methods may also remove silicon nitride more rapidly that silicon carbide and silicon oxycarbide which broadens the utility of the present technology to semiconductor applications.

14 Claims, 6 Drawing Sheets

SILICON ADDITION FOR SILICON NITRIDE ETCHING SELECTIVITY

TECHNICAL FIELD

The present technology relates to semiconductor processes and equipment. More specifically, the present technology relates to selectively etching silicon nitride.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials whereas a wet phosphoric acid etch preferentially removes silicon nitride. However, wet processes may have difficulty penetrating some constrained trenches and also may sometimes deform the remaining material. Dry plasma etches can penetrate more constrained trenches and exhibit less deformation of delicate remaining structures. However, semiconductor manufacturing benefits from an increase in etch selectivity.

Thus, there is a need for improved systems and methods that can be used to produce high quality devices and structures. These and other needs are addressed by the present technology.

SUMMARY

Exemplary methods may include flowing a fluorine-containing precursor into a substrate processing region of a semiconductor processing chamber. The methods may further include flowing an oxygen-containing precursor into the substrate processing region and flowing silicon-containing precursor into the substrate processing region. A substrate is positioned within the substrate processing region and the substrate includes an exposed portion of silicon nitride. The methods may further include forming a local plasma having a local plasma power in the substrate processing region from the fluorine-containing precursor, the oxygen-containing precursor and the silicon-containing precursor. Forming the local plasma produces plasma effluents. The methods may further include applying bias plasma power to the substrate processing region and applying the bias plasma power accelerates the plasma effluents towards the substrate. The methods may further include selectively and directionally removing silicon nitride from the exposed portion of silicon nitride.

In some embodiments the local plasma may be formed by applying an inductively-coupled source plasma power to the substrate processing region. The substrate may further include at least one of an exposed portion of silicon oxide, an exposed portion of silicon carbide or an exposed portion of silicon oxycarbide. The selective and directional removal of silicon nitride removes silicon nitride at an etch rate more than twenty times faster than material is removed from the exposed portion of silicon oxide, silicon carbide or silicon oxycarbide. The selective and directional removal of silicon nitride may be performed at a substrate temperature of between −50° C. and 150° C. The selective and directional removal of silicon nitride may be performed at a pressure of between 0.1 mTorr and 100 mTorr. A silicon-containing partial pressure of the silicon-containing precursor may be less than 75% of an oxygen-containing partial pressure of the oxygen-containing precursor. The fluorine-containing precursor may include fluorine, carbon, and hydrogen. The silicon-containing precursor may have one and only one silicon atom. The silicon-containing precursor may be selected from the group consisting of silane ($SiH_4$), silicon tetrafluoride ($SiF_4$), and silicon tetrachloride ($SiCl_4$). The source plasma power may be between 100 W and 2 kW.

The present technology may also encompass additional etching methods. The methods may include combining a fluorine-and-carbon-containing precursor, an oxygen-containing precursor, and a silicon-containing precursor in a substrate processing region. The patterned substrate may be disposed within the substrate processing region and may have an exposed portion of silicon nitride and an exposed portion of silicon oxide. The methods may include forming a local plasma in the substrate processing region. The local plasma may be formed by applying a source plasma power to the combination of the fluorine-and-carbon-containing precursor, the oxygen-containing precursor, and the silicon-containing precursor inside the substrate processing region. The methods may include applying a bias plasma power to the substrate processing region. The methods may include selectively removing silicon nitride from the exposed portion of silicon nitride.

In some embodiments the fluorine-and-carbon-containing precursor consists of fluorine, carbon and hydrogen. The fluorine-and-carbon-containing precursor may have one and only one carbon atom. The fluorine-and-carbon-containing precursor may be fluoromethane ($CH_3F$). The methods may further include pulsing the source plasma power during the selective removal of silicon nitride. The selective removal of silicon nitride may remove silicon nitride at more than twenty times the rate silicon oxide is removed from the exposed portion of silicon oxide.

The present technology may also encompass additional etching methods. The methods may include transferring a patterned substrate having an exposed portion of silicon nitride, an exposed portion of silicon carbide and an exposed portion of silicon oxide into a substrate processing region of a substrate processing chamber. The methods may include flowing fluoromethane ($CH_3F$) into the substrate processing region. The methods may include flowing oxygen ($O_2$) into the substrate processing region. The methods may include flowing silicon tetrachloride ($SiCl_4$) into the substrate processing region. The methods may include forming a local plasma in the substrate processing region. The local plasma may be formed by applying an inductively-coupled source plasma power to the substrate processing region. The methods may include applying a capacitively-coupled bias plasma power to the substrate processing region. The methods may include selectively and directionally removing silicon nitride from the exposed portion of silicon nitride at an etch rate more than twenty times faster than material is removed from the exposed portion of silicon carbide or the exposed portion of silicon oxide. The methods may include removing the patterned substrate from the substrate processing region. A silicon tetrachloride partial pressure of the silicon tetrachloride may be less than 25% of an oxygen partial pressure of the oxygen ($O_2$). The selective and directional removal of silicon nitride may include etching into the patterned substrate orthogonally to a surface of the patterned substrate.

Such technology may provide numerous benefits over conventional systems and techniques. For example, the processes may enable the patterning of integrated circuit features having reduced feature sizes. Additionally, the operations of some embodiments of the present technology may increase selectivity of silicon nitride while retaining more exposed silicon carbide and/or silicon oxycarbide. The etch selectivity of silicon nitride relative to silicon oxide may also be increased relative to conventional local plasma processes. These and other embodiments, along with many of their advantages and features, are described in more detail in conjunction with the below description and attached figures.

DESCRIPTION OF THE DRAWINGS

A further understanding of the nature and advantages of the embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

A growing number of semiconductor applications (e.g. silicon nitride spacer etch, mask open, or self-aligned contact etch) present exposed portions of silicon nitride and one or more exposed portions of silicon oxide, silicon carbide or silicon oxycarbide on a patterned substrate. Each application benefits from a directional and selective process for removing silicon nitride from the exposed portion of silicon nitride while retaining the other materials. Silicon nitride is typically more difficult to remove than the softer materials which include oxygen and/or carbon.

A local plasma formed from nitrogen trifluoride exhibits very poor if any selectivity to silicon nitride in contrast to a combination of oxygen ($O_2$) and fluoromethane ($CH_3F$) which has been found to remove silicon nitride with an etch selectivity of about 4:1 compared to SiO, SiC and SiOC. The targeted semiconductor applications benefit from a process which has a higher silicon nitride selectivity. Benefits of the methods described herein relate to achieving a silicon nitride etch selectivity greater than 8:1 (SiN:SiC, SiN:SiO, and/or SiN:SiOC) which enables, for example, contact holes to be made more circular and reduces other pattern distortions on etched patterned substrate. Exemplary methods for selectively removing silicon nitride may include flowing a fluorine-containing precursor, and oxygen-containing precursor and a silicon-containing precursor into a local plasma to form plasma effluents. The plasma effluents may then remove silicon nitride at significantly higher etch rates compared to exposed silicon oxide on the substrate. The methods may also remove silicon nitride more rapidly that silicon carbide and silicon oxycarbide which broadens the utility of the present technology to semiconductor applications.

The combination of the silicon-containing precursor, the fluorine-containing precursor, and the oxygen-containing precursor in a local plasma to effect a directional silicon nitride etch may result in an etch selectivity (SiN:SiO) which is greater than 8:1, greater than 10:1, greater than 13:1, greater than 15:1, greater than 18:1, greater than 20:1, or greater than 25:1 in embodiments. The etch technologies described herein may also result in an etch selectivity (SiN:SiC) which is greater than 8:1, greater than 10:1, greater than 13:1, greater than 15:1, greater than 18:1, greater than 20:1, or greater than 25:1 according to embodiments. The present etch technology may similarly result in an etch selectivity (SiN:SiOC) which is greater than 8:1, greater than 10:1, greater than 13:1, greater than 15:1, greater than 18:1, greater than 20:1, or greater than 25:1 in embodiments. For the sake of brevity, the etch selectivities, precursors, process parameters and process characteristics described herein may be applied to all disclosed embodiments and are not limited to the one particular embodiment in which the property is presented.

The addition of a silicon-containing precursor (which is typically a deposition precursor) to an etch process could have been expected to shut off etch rates on all exposed surfaces. However, the silicon-containing precursors as described herein appear to possess differentiated sticking coefficients on the variety of exposed substrate portions (SiN, SiO, SiC and SiOC). Fortunately, the sticking coefficients of the plasma effluents produced from the silicon-containing precursor appear to be higher on precisely the materials which need to be retained for the present semiconductor applications. The silicon-containing precursor may be one of $SiCl_4$, $SiH_4$, or $SiF_4$ and plasma effluents formed therefrom may be depositing a small amount of silicon-based compounds onto exposed portions of silicon oxide, silicon carbide or silicon oxycarbide. Silicon nitride appears to be slightly more inert to the silicon plasma effluents such that any deposition reaction is prevented or occurs with insufficient frequency to inhibit silicon nitride removal. The silicon-containing precursor may have one but only one silicon atom, in embodiments, since longer chains with two or more silicon atoms may begin detrimentally depositing on the exposed silicon nitride. Additional process information will be described while and also after exemplary hardware is disclosed.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described.

Figure 1:
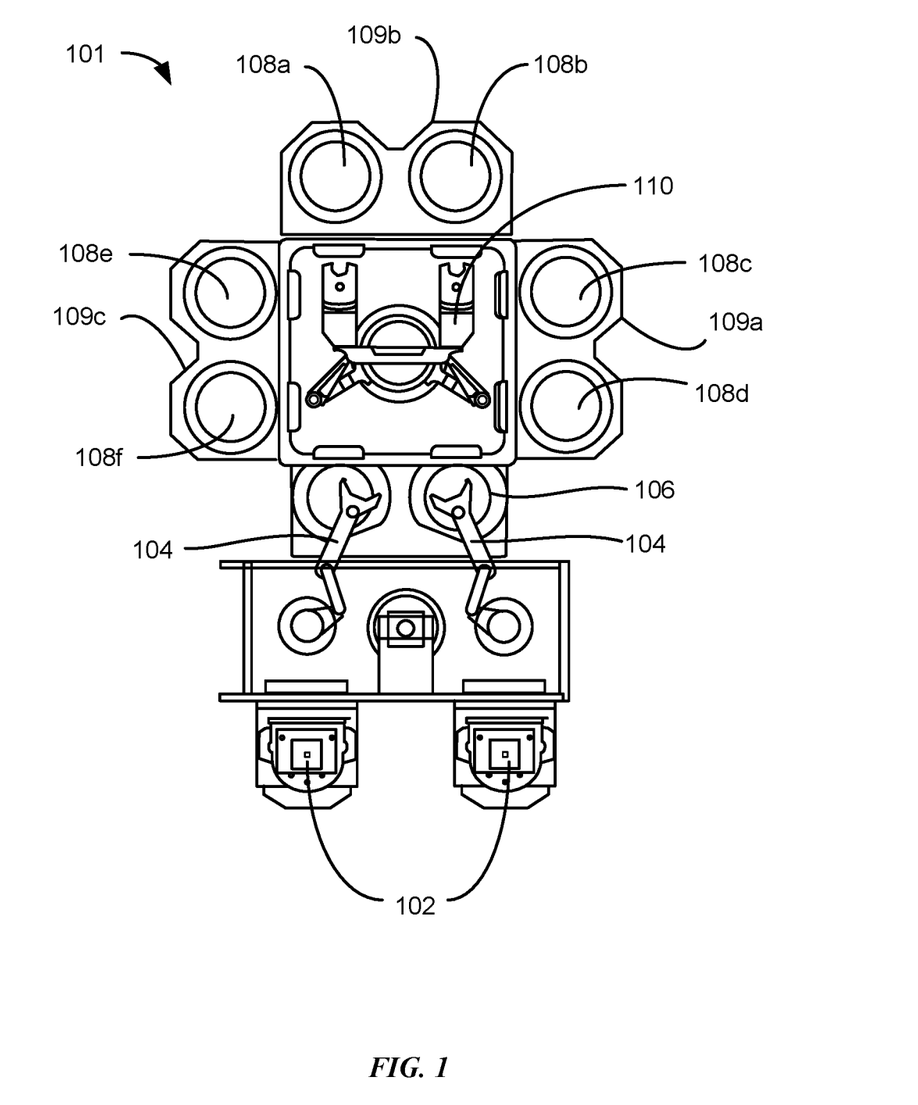
FIG. 1 shows a top plan view of one embodiment of an exemplary processing system according to embodiments of the present technology.

FIG. 1 shows a top plan view of one embodiment of a substrate processing system 101 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2:
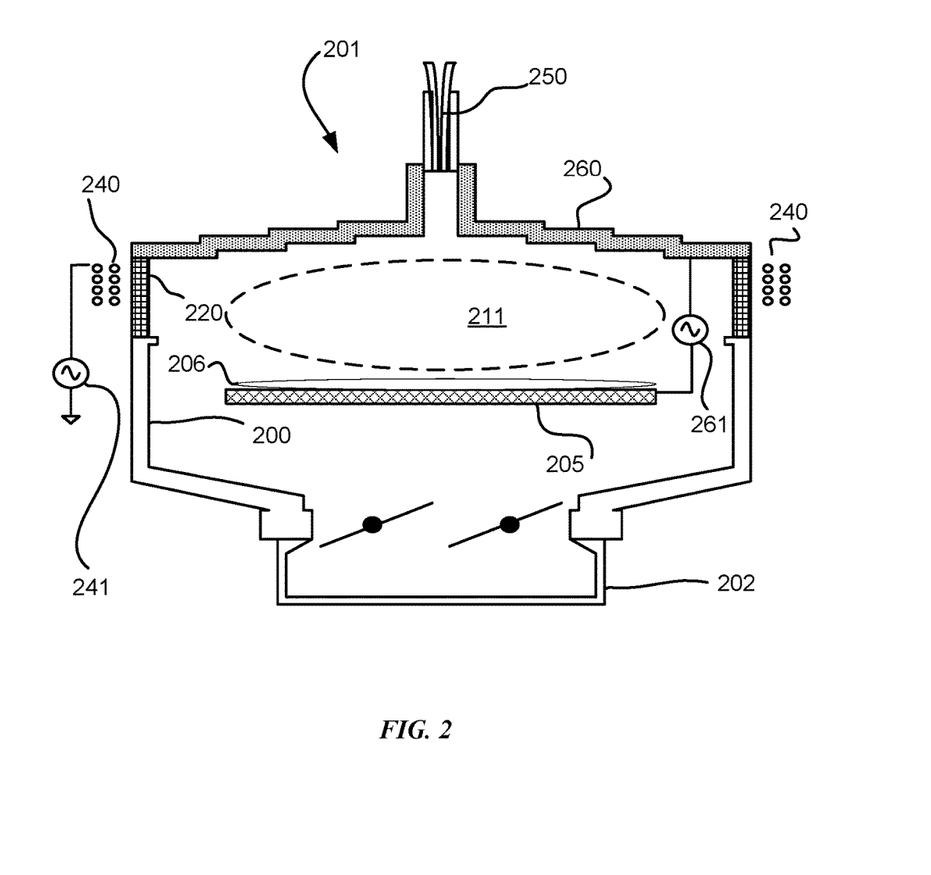
FIG. 2 is a schematic diagram of a substrate processing chamber which can be used to carry out selective silicon nitride etch processes according to embodiments.

FIG. 2 shows a schematic of an exemplary substrate processing chamber which may be used to perform exemplary silicon nitride etch processes. A wide variety of substrate processing chambers may also be used to perform claimed the silicon nitride etch processes described herein. The exemplary substrate 206 has exposed portions of silicon nitride and one or more of exposed portions of silicon oxide, silicon carbide, and/or silicon oxycarbide. The substrate may be transferred into the substrate processing region 211 of the substrate processing chamber 201. A local plasma is formed from the fluorine-containing precursor, the oxygen-containing precursor and the silicon-containing precursor within the substrate processing region 211. The combination of precursors may be flowed into the substrate processing region 211 before and/or during the application of the RF power to form the local plasma. Some or all of the exposed silicon nitride portion is removed by reacting plasma effluents with the substrate 206 and in particular with the exposed portion of silicon nitride. Etch removal byproducts may be pumped out of the substrate processing region through vacuum pump 202.

During the selective silicon nitride etch process, the fluorine-containing, the oxygen-containing, and the silicon-containing precursors may be delivered through gas inlets 250 into substrate processing region 211. The combination of precursors is excited in an inductively-coupled plasma created by applying inductively-coupled power in the form of alternating current (AC) power 241 to inductive coils 240. The plasma will be referred to herein as a local plasma and is applied with a source plasma power in combination with a bias plasma power as described below. Electromagnetic radiation passes through dielectric window 220 to ignite a plasma in substrate processing region 211 from the combination of precursors. Dielectric window 220 mates with bottom chamber portion 200 to form the bulk of the substrate processing chamber 201.

The source plasma power may be applied as an RF frequency from AC power supply 241 to form the local plasmas described herein. The RF frequency applied may be a low frequency less than about 200 kHz, high RF frequencies between about 10 MHz and about 15 MHz, or microwave frequencies greater than or about 1 GHz in embodiments. Plasma-excitation of the combination of precursors forms plasma effluents. The plasma effluents include neutral chemical fragments as well as ions which are accelerated toward substrate 206 by applying an accelerating electrical potential (e.g. AC power 261) to conductive lid 260 relative to substrate pedestal 205. The substrate pedestal 205 and the substrate 206 are in contact with one another and are at approximately the same or at the same electrical potential in embodiments. The accelerating potential may be alternating current (AC), direct current (DC) or a combination of the two. AC power supply 241 is used to apply the source plasma power and AC power 261 is used to supply the bias plasma power. The total plasma power is the sum of the source plasma power and the bias plasma power.

The methods described herein include applying energy to the combination of precursors in the local plasma inside the substrate processing region to generate ions and radicals used to etch the substrate in the substrate processing chamber. Generally speaking, the local plasma may be generated using known techniques (e.g., radio frequency excitations, capacitively-coupled power and/or inductively coupled power) or a combination of known techniques, for example, to apply a source plasma power and a bias plasma power. In an embodiment, the source plasma power is applied using plasma power supply unit 241. The plasma power supply unit 241 may be referred to herein as the source plasma power supply. The AC power is supplied to the inductive coils 240 shown in cross-section in FIG. 2. The bias plasma power is supplied with auxiliary power supply unit 261. The auxiliary power supply unit 261 may be referred to as the bias plasma power supply. The source plasma power may be between about 100 W and 2 kW, between 200 W and 1500 W, between 300 W and 1000 W, or between 400 W and 800 W in embodiments. The source plasma power and/or the bias plasma power may be pulsed to further limit or reduce deposition onto exposed portions of silicon nitride and further increase silicon nitride etch selectivity. In embodiments, an AC or DC (or AC+DC) accelerating voltage may be applied between substrate pedestal 205 and conductive lid 260 to accelerate ions and selectively remove exposed silicon nitride from the substrate 206. The application of the accelerating voltage applies a bias plasma power and makes the silicon nitride etch process directional or more directional compared with no bias plasma power.

An inductively-coupled plasma may be ignited by applying a current in the inductive coils 240. The current circulating in the inductive coils 240 may induce a perpendicular magnetic field which itself induces an electric field in the chamber inside (substrate processing region 211) that sustains the plasma. The plasma may therefore be ignited by what we call "source power" applied in the coils 240. There may be an additional capacitively coupled power source (referred to herein as "bias power") applied to the substrate pedestal 205. The bias power may be applied between substrate pedestal 205 and a top electrode disposed above the substrate 206 but within the substrate processing region 211. The top electrode may be separate from the lid of the chamber or may be the conductive lid 260 (as shown in FIG. 2). In embodiments, the bias power is independent from the source power. The source power ignites the plasma and the bias power accelerate the ions formed in the plasma downward towards the substrate 206 according to embodiments.

The bias plasma power may be greater than 5% of the source plasma power, greater than 10% of the source plasma power, greater than 15% of the source plasma power, or greater than 20% of the source plasma power according to embodiments. The bias plasma power may be between 5% and 100% of the source plasma power, between 10% and 70% of the source plasma power, between 15% and 50% of the source plasma power or between 20% and 40% of the source plasma power in embodiments. The pressure within the substrate processing chamber may be between 0.1 mTorr and 200 mTorr, between 0.5 mTorr and 100 mTorr, between 1 mTorr and 50 mTorr, between 1 mTorr and 20 mTorr or between 1 mTorr and 10 mTorr, during etching operations described herein according to embodiments.

Figure 3:
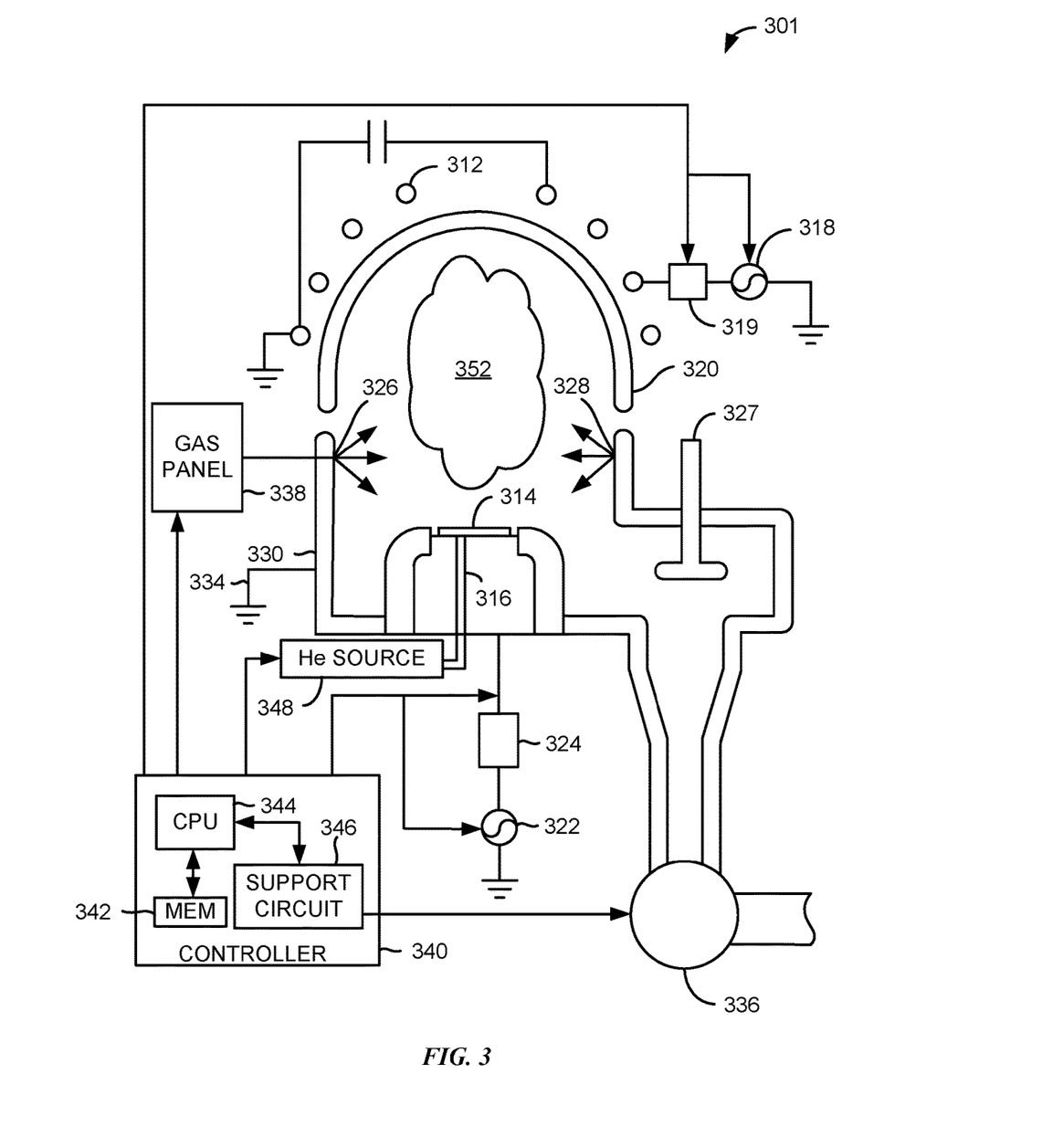
FIG. 3 is a schematic diagram of a substrate processing chamber which can be used to carry out selective silicon nitride etch processes according to embodiments.

Additional considerations will be presented in the course of presenting an alternative exemplary substrate processing chamber which may be used to perform selective silicon nitride etch processes described herein. FIG. 3 depicts a schematic diagram of a substrate processing chamber 301 which can be incorporated into a substrate processing system 101 described previously with reference to FIG. 1. The exemplary substrate processing chamber 301 may also be referred to as a decoupled-plasma source chamber or DPS chamber. The substrate processing chamber 301 includes inductive coils 312, positioned exterior to a dielectric, a dome-shaped ceiling 320 (referred to herein as the dome 320). Other chambers may have other types of ceilings, e.g., a flat ceiling. The inductive coil 312 can be coupled to a radio-frequency (RF) source 318 (that is generally capable of producing an RF signal having a tunable frequency). The RF source 318 is coupled to the inductive coil 312 through a matching network 319. The substrate processing chamber 301 can include a substrate support pedestal (cathode) 316 that is coupled to a second RF source 322 that is generally capable of producing a DC bias relative to dome 320 and/or may apply an RF signal relative to various parts of the substrate processing chamber 301. The RF source 322 can be coupled to the pedestal 316 through a matching network 324. The substrate processing chamber 301 may also contain a conductive chamber wall 330 that is connected to an electrical ground 334. A controller 340 including a central processing unit (CPU) 344, a memory 342, and support circuits 346 for a CPU 344 is coupled to various components of substrate processing chamber 301 to facilitate control of the selective etch process.

In operation, a semiconductor substrate 314 is placed on the pedestal 316 and gases are supplied from the gas handling system 338 to the substrate processing chamber 301 through entry ports (326, 328) into the substrate processing region 352. A local plasma is ignited in substrate processing region 352 in substrate processing chamber 301 by applying RF power from RF sources 318 and 322 respectively to the inductive coil 312 and the pedestal 316. RF source 318 represents the supply of source plasma power and the RF source 322 represents the supply of bias plasma power. Ions in the plasma effluents are accelerated using the RF source 322 toward the substrate 314 which is located in the substrate processing region 352. The pressure within the interior of the substrate processing chamber 301 is controlled using a throttle valve 327 situated between the substrate processing chamber 301 and a vacuum pump 336. The temperature at the surface of the chamber wall 330 is controlled using liquid-containing conduits (not shown) that are located in the chamber wall 330 of the substrate processing chamber 301.

The temperature of the substrate 314 is controlled by stabilizing the temperature of the pedestal 316 and flowing helium gas from a helium source 348 to channels formed by the back of the substrate 314 by grooves (not shown) on the pedestal surface. The helium gas is used to facilitate heat transfer between the pedestal 316 and the substrate 314. During the etch process, the substrate 314 is heated by a resistive heater within the pedestal 316 to a steady state temperature and the helium facilitates uniform heating of substrate 314. Using thermal control of both the dome 320 and the pedestal 316, the substrate 314 is maintained at a temperature of between −50° C. and 150° C.

Figure 4:
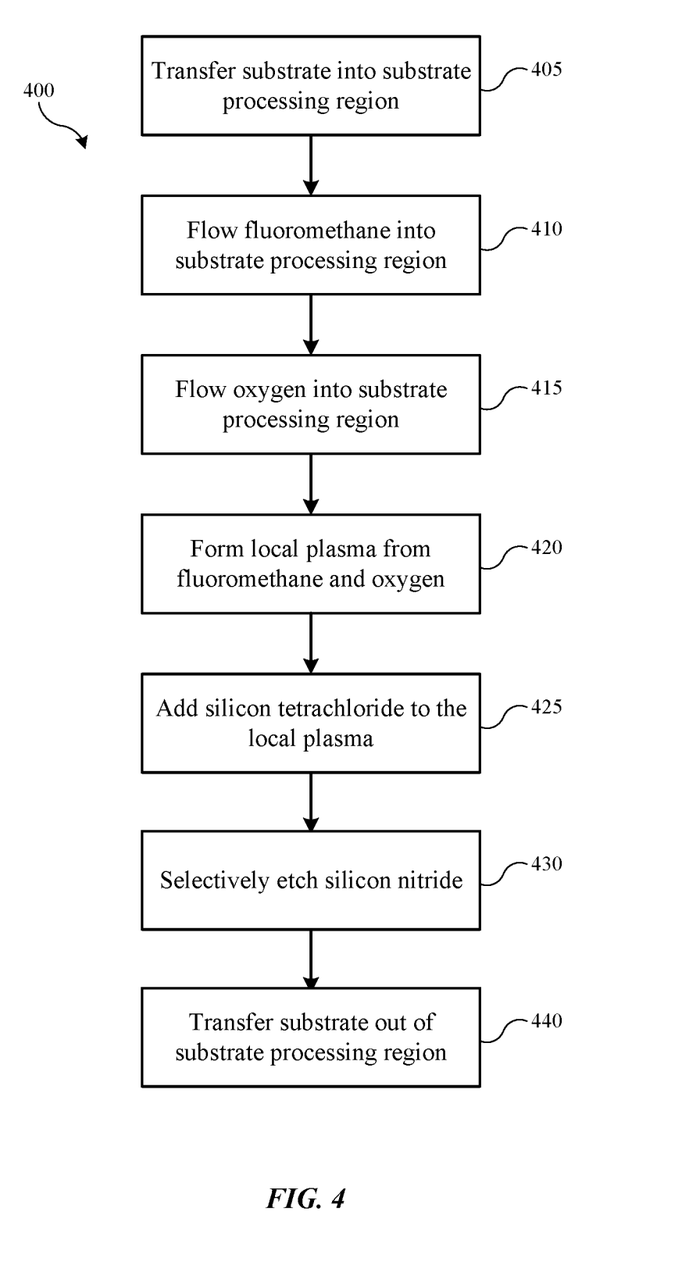
FIG. 4 shows exemplary operations in a method according to embodiments of the present technology.

FIG. 4 shows exemplary operations in a method 400 according to embodiments of the present technology. The chambers discussed previously may be used to perform any of the etching methods described herein. The substrate may be patterned to form exposed portions of silicon nitride prior to the first operation of the method 400. The patterned substrate has exposed portions of silicon nitride and one or more of exposed portions of silicon oxide, silicon carbide or silicon oxycarbide.

The substrate is transferred into the substrate processing region of a substrate processing chamber in operation 405. The method 400 may include flowing fluoromethane ($CH_3F$) into the substrate processing region in operation 410. Oxygen ($O_2$) is flowed into the substrate processing region at operation 415. An exemplary chamber may be the substrate processing chambers (201, 301) previously described, which may include substrate processing region 211 or 352, respectively. A local plasma may be generated within the substrate processing region at operation 420 by applying both a source plasma power and a bias plasma power to the combination of precursors. Silicon tetrachloride may be added to the plasma (operation 425) or may be present prior to initiating the plasma according to embodiments. Plasma effluents are generated from the combination of precursors, including each of the silicon tetrachloride, the fluoromethane, and the oxygen ($O_2$). The plasma effluents react with the top surface of the substrate, which has the exposed portions recited previously. The plasma effluents selectively etch the exposed portion of silicon nitride faster than the other exposed portions present at operation 430. The plasma may be turned off and the process effluents (unreacted plasma effluents and reaction by-products) may be removed from the substrate processing region. The substrate may be removed from the substrate processing region at operation 440.

Figure 5:
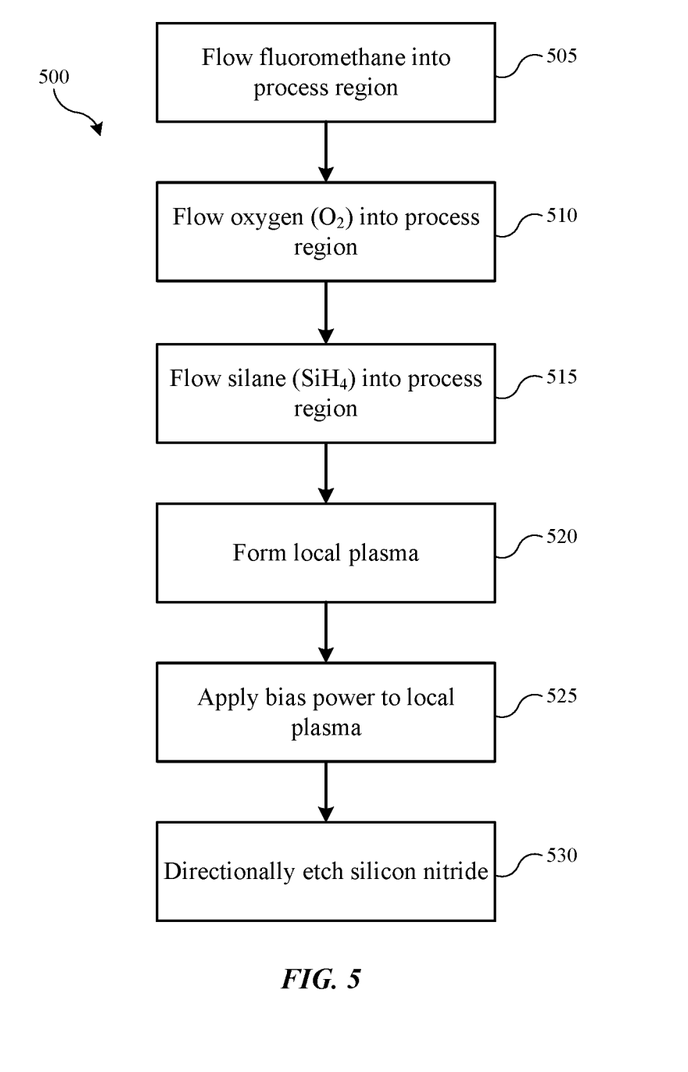
FIG. 5 shows exemplary operations in a method according to embodiments of the present technology.

FIG. 5 shows exemplary operations in a method 500 according to embodiments of the present technology. The substrate processing chambers discussed previously may again be used to perform this exemplary silicon nitride etch process 500. The substrate is prepared with an exposed portion of silicon nitride and one or more of exposed portions of silicon oxide, silicon carbide or silicon oxycarbide. Fluoromethane ($CH_3F$), oxygen ($O_2$) and silane ($SiH_4$) are flowed into the substrate processing region in operations 505-515. A local plasma is formed from the combination of precursors (operation 520). The method 500 further includes applying a bias plasma power (operation 525) to accelerate charged species of the plasma effluents towards the substrate. The plasma effluents preferentially react with the exposed portion of silicon nitride on the top surface of the substrate in operation 530. The plasma effluents selectively etch the exposed portion of silicon nitride faster than the other exposed portions present on the top surface. The plasma may be turned off and the process effluents (unreacted plasma effluents and reaction by-products) may be removed from the substrate processing region.

Precursors used in all the selective silicon nitride etch processes discussed herein may more generally be a fluorine-containing precursor, an oxygen-containing precursor and a silicon-containing precursor. The fluorine-containing precursor may include at least one precursor selected from the group of atomic fluorine, diatomic fluorine, nitrogen trifluoride, carbon tetrafluoride, hydrogen fluoride, xenon difluoride, and various other fluorine-containing precursors used or useful in semiconductor processing. The fluorine-containing precursor may further comprise carbon and thus be referred to as a fluorine-and-carbon-containing precursor. The fluorine-and-carbon-containing precursor may further comprise hydrogen. The fluorine-and-carbon-containing precursor may comprise or consist of fluorine, carbon, and hydrogen according to embodiments. The fluorine-and-carbon-containing precursor may comprise one or more of $CF_4$, $CF_3H$, $CF_2H_2$, and/or $CFH_3$. Use of a fluorine-and-carbon-containing precursor has been found to increase the silicon nitride etch selectivity compared to other fluorine-containing precursors. Additionally, fluoromethane ($CFH_3$) has been found to increase the silicon nitride selectivity compared to $CF_4$, $CF_3H$, and $CF_2H_2$. The fluorine-and-carbon-containing precursor may have one and only one carbon atom, which may discourage excessive deposition onto the silicon nitride and degrade achievement of a high silicon nitride etch selectivity.

The oxygen-containing precursor may include one or more of atomic oxygen, molecular oxygen ($O_2$), $CO_2$, $N_2O$, NO, $NO_2$, or ozone. As described elsewhere herein, the silicon-containing precursor may be one of $SiCl_4$, $SiH_4$, or $SiF_4$ in embodiments. The silicon-containing precursor may have one and only one silicon atom, according to embodiments, since longer chains with two or more silicon atoms may begin detrimentally depositing on the exposed silicon nitride. The precursors may also include any number of carrier gases, which may include nitrogen, helium, argon, or other noble, inert, or useful precursors. In embodiments, the etch processes described herein may also be used to selectively remove silicon nitride while retaining silicon (e.g. crystalline silicon or polysilicon). The silicon nitride etch selectivity may be increased, according to embodiments, by selecting silane ($SiH_4$) instead of other silicon-containing precursor options such as $SiCl_4$ or $SiF_4$. Silicon tetrachloride ($SiCl_4$) or silicon tetrafluoride ($SiF_4$) may etch exposed silicon whereas silane may not.

In exemplary methods, such as methods 400 and 500, the oxygen-containing precursor and the silicon-containing precursor may be participating in the beneficial deposition of silicon onto exposed portions of silicon oxide, silicon carbide and/or silicon oxycarbide. The selective deposition of silicon oxide onto these surfaces rather than onto exposed portions of silicon nitride may be causing the high etch selectivities observed and recited herein. The ratio of the oxygen-containing precursor to the silicon-containing precursor may be manipulated to promote the selectivity of the deposition of silicon oxide. Detrimental deposition of silicon oxide onto the exposed portion of silicon nitride may occur (and compromise etch selectivity) for proportions of the silicon-containing precursor (e.g. $SiCl_4$ $SiH_4$ or $SiF_4$) which exceed threshold amounts. The etch processes described herein could stagnate on all exposed surfaces.

The silicon-containing precursor may be flowed into the substrate processing region during the formation of the local plasma at less than 25%, less than 20%, less than 15%, less than 10%, or less than 7% of the rate at which the oxygen-containing precursor is flowed into the substrate processing region according to embodiments. Alternatively (or in combination), the partial pressure of the silicon-containing precursor within the substrate processing region during the formation of the local plasma may be less than 25%, less than 20%, less than 15%, less than 10%, or less than 7% of the partial pressure of the oxygen-containing precursor within the substrate processing region according to embodiments.

Some of the precursors used as the silicon-containing precursor (e.g. $SiF_4$) resulted in less deposition onto exposed portions of silicon oxide, silicon carbide and silicon oxycarbide than, for example, silicon tetrachloride. Therefore, in embodiments, the silicon-containing precursor may be flowed into the substrate processing region during the formation of the local plasma at less than 75%, less than 60%, less than 50%, or less than 40% of the rate at which the oxygen-containing precursor is flowed into the substrate processing region according to embodiments. Higher flow-rates may be easier to control in some cases.

The selective etch processes disclosed herein may be less sensitive to the flow rate ratio of the fluorine-containing precursor to the other two precursors. The fluorine-containing precursor may be flowed into the substrate processing region during the formation of the local plasma at more than half, greater than 75%, greater than 100%, greater than 150%, or greater than 200% of the rate at which the oxygen-containing precursor is flowed into the substrate processing region in embodiments. Alternatively (or in combination), the partial pressure of the fluorine-containing precursor within the substrate processing region during the formation of the local plasma may be more than 50%, more than 75%, more than 100%, more than 150%, or more than 200% of the partial pressure of the oxygen-containing precursor within the substrate processing region according to embodiments.

The temperature of the substrate while selectively removing silicon nitride in the processes described herein may be between −50° C. and 150° C., between −30° C. and 130° C., or between −10° C. and 110° C. In a preferred embodiment, the substrate temperature may be between 70° C. and 110° C. during the etch processes described herein to increase the silicon nitride selectivity relative to silicon oxide. Lower substrate temperatures sacrifice silicon nitride selectivity and higher substrate temperatures sacrifice profile control.

Figure 6A:
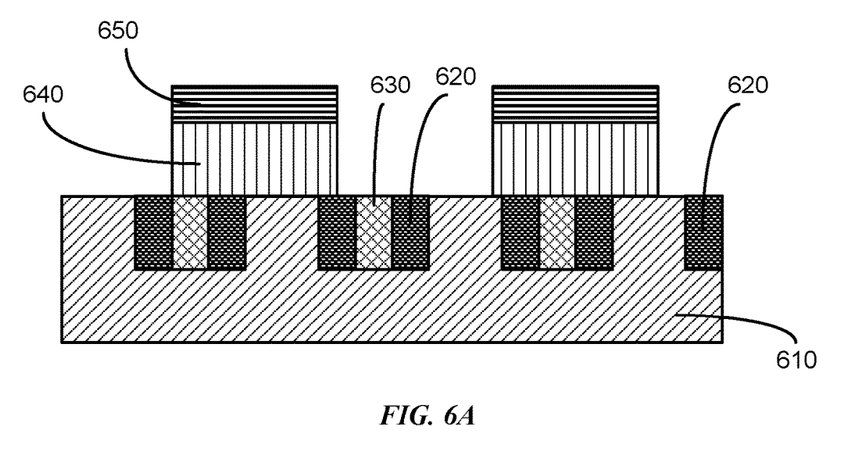
FIGS. 6A and 6B show cross-sectional views of substrates being processed according to embodiments of the present technology.
Figure 6B:
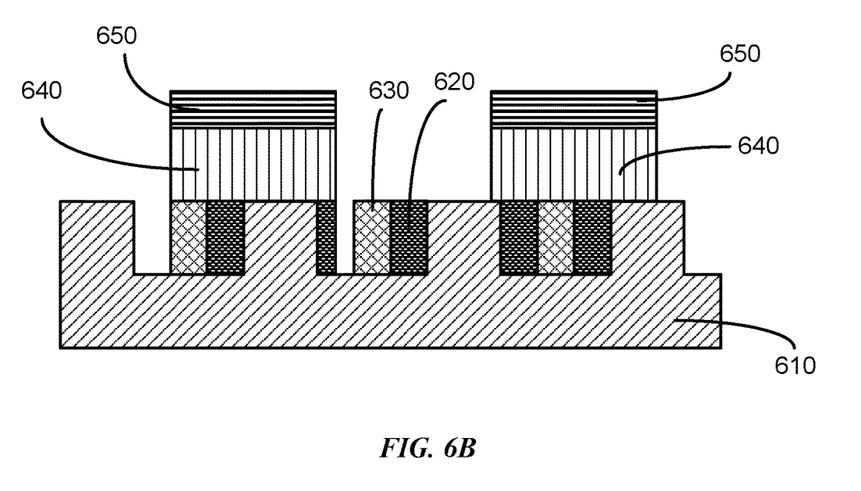

FIGS. 6A and 6B show cross-sectional views of substrates being processed according to embodiments of the present technology. The selective silicon nitride etch processes described herein may be used on a wide variety of semiconductor device applications such as a silicon nitride spacer etch, a mask open or a self-aligned contact etch. FIGS. 6A and 6B roughly correspond to a contact etch. In FIG. 6A, exposed portions of silicon carbide 630, exposed portions of silicon nitride 620, and exposed portions of silicon oxide 610 are shown. The patterned layers are represented as patterned layer 640 and mask 650. Patterned layer 640 may be an oxide hardmask and mask 650 may be hydrogenated amorphous carbon (e.g. APF™ available from Applied Materials).

The etch processes described herein may be used to remove some of the exposed portions of silicon nitride 620 which are not covered by the patterned layer 640 or the mask 650, resulting in the cross-sectional view of FIG. 6B. The etch processes (e.g. 400 and 500 discussed above) may selectively remove silicon nitride 620 while retaining all or most of silicon oxide 610 and silicon carbide 630 according to embodiments. The etch process may also be very directional in addition to being highly selective. The etch process may proceed perpendicur to the top surface of the substrate in embodiments, in part, due to the application of the bias plasma power discussed herein. The etch progress may proceed downward into the substrate at 90 degrees from the top surface of the substrate in embodiments. The present technology may also result in essentially no or no footing or notches and essentially no or no corner rounding according to embodiments. The etch processes discussed also may avoid etching hydrogented amorphous carbon 650 and oxide hardmask 640 with the same high selectivities recited herein. The broad-based selectivity of the silicon nitride etch processes described herein make a wide variety of semiconductor applications available to these etch processes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
    flowing a fluorine-containing precursor into a substrate processing region of a semiconductor processing chamber;
    flowing an oxygen-containing precursor into the substrate processing region;
    flowing a silane into the substrate processing region, wherein a substrate is positioned within the substrate processing region and the substrate comprises an exposed portion of silicon nitride, an exposed portion of silicon oxide, and an exposed portion of a silicon-and-carbon containing material; wherein the silicon-and-carbon containing material comprises silicon carbide or silicon oxycarbide;
    forming a local plasma having a local plasma power in the substrate processing region from the fluorine-containing precursor, the oxygen-containing precursor and the silane, wherein forming the local plasma produces plasma effluents;
    applying bias plasma power to the substrate processing region, wherein applying the bias plasma power accelerates the plasma effluents towards the substrate, and wherein the bias plasma power is between about 20% and about 40% of a source power used to form the local plasma: and
    selectively and directionally removing silicon nitride from the exposed portion of silicon nitride.

2. The method of claim 1, wherein the local plasma is formed by applying an inductively-coupled source plasma power to the substrate processing region.

3. The method of claim 1, wherein the selective and directional removal of silicon nitride removes silicon nitride at an etch rate more than twenty times faster than material is removed from the exposed portion of silicon oxide, and the exposed portion of the silicon-and-carbon containing material.

4. The method of claim 1, wherein the selective and directional removal of silicon nitride is performed at a temperature of between 70° C. and 110° C.

5. The method of claim 1, wherein the selective and directional removal of silicon nitride is performed at a pressure of between 0.1 mTorr and 100 mTorr.

6. The method of claim 1, wherein a silicon-containing partial pressure of the silane is less than 75% of an oxygen-containing partial pressure of the oxygen-containing precursor.

7. The method of claim 1, wherein the fluorine-containing precursor comprises fluorine, carbon, and hydrogen.

8. The method of claim 1, wherein the local plasma power is between 100 W and 2 kW.

9. An etching method comprising:
    combining a fluorine-and-carbon-containing precursor, an oxygen-containing precursor, and a silane in a substrate processing region, wherein a patterned substrate is disposed within the substrate processing region and has an exposed portion of silicon nitride, an exposed portion of a silicon-and-carbon containing material, and an exposed portion of silicon oxide;

wherein the silicon-and-carbon containing material comprises silicon carbide or silicon ox carbide;

forming a local plasma in the substrate processing region, wherein the local plasma is formed by applying a source plasma power to the combination of the fluorine-and-carbon-containing precursor, the oxygen-containing precursor, and the silane inside the substrate processing region;

applying a bias plasma power to the substrate processing region, wherein the bias power is between about 20% and about 40% of a plasma source forming the local plasma: and selectively removing silicon nitride from the exposed portion of silicon nitride, wherein the patterned substrate temperature is maintained between about 70° C. and about 110° C. during the etching method.

10. The etching method of claim 9, wherein the fluorine-and-carbon-containing precursor consists of fluorine, carbon and hydrogen.

11. The etching method of claim 9, wherein the fluorine-and-carbon-containing precursor has one and only one carbon atom.

12. The etching method of claim 9, wherein the fluorine-and-carbon-containing precursor is fluoromethane ($CH_3F$).

13. The etching method of claim 9, further comprising pulsing the source plasma power during the selective removal of silicon nitride.

14. The method of claim 9, wherein the selective removal of silicon nitride removes silicon nitride at more than twenty times the rate silicon oxide is removed from the exposed portion of silicon oxide, and at more than twenty times the rate a silicon-and-carbon containing film is removed.

* * * * *